US009929569B2

(12) United States Patent
Tillotson et al.

(10) Patent No.: US 9,929,569 B2
(45) Date of Patent: Mar. 27, 2018

(54) METHODS FOR STEERING A MAGNETIC FIELD FOR SMART WIRELESS POWER TRANSMISSION

(71) Applicant: The Boeing Company, Chicago, IL (US)

(72) Inventors: Brian J. Tillotson, Kent, WA (US); Peng Zeng, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 681 days.

(21) Appl. No.: 14/535,383

(22) Filed: Nov. 7, 2014

(65) Prior Publication Data

US 2016/0134126 A1    May 12, 2016

(51) Int. Cl.
*H02J 5/00* (2016.01)
*H01F 38/14* (2006.01)
(Continued)

(52) U.S. Cl.
CPC ............. *H02J 5/005* (2013.01); *G01B 7/30* (2013.01); *G01R 19/04* (2013.01); *H01F 38/14* (2013.01);
(Continued)

(58) Field of Classification Search
CPC .. H02J 5/005; H02J 50/90; H02J 50/10; H02J 50/80; H02J 50/70; G01B 7/30;
(Continued)

(56) References Cited

U.S. PATENT DOCUMENTS

| 9,673,666 B2 * | 6/2017 | Ryu ..................... H04B 5/0037 |
| 2008/0238413 A1 | 10/2008 | Anderson |
| 2011/0210621 A1 | 9/2011 | Iwaisako et al. |

FOREIGN PATENT DOCUMENTS

| CA | 2868101 A1 | 10/2013 |
| EP | 1066584 A1 | 1/2001 |
| WO | 2015134077 A1 | 9/2015 |

OTHER PUBLICATIONS

Extended European Search Report for European Application No. 15191194.8 (European counterpart of the instant patent application) dated Mar. 18, 2016.

(Continued)

*Primary Examiner* — Jung Kim
(74) *Attorney, Agent, or Firm* — Ostrager Chong Flaherty & Broitman P.C.

(57) ABSTRACT

Systems and methods for mitigating constraints associated with wireless power transmission in applications where the position and orientation of the desired magnetic field changes over time, for example, because the position and orientation of the receiver being powered changes over time or because different receivers having different positions and orientations are being powered at different times. In accordance with some embodiments, the system employs a plurality of wireless power transmitters in a defined space, each transmitter consisting of individual coils oriented orthogonally relative to each other. Using field interference amongst these individual coils as well as amongst the transmitters they form, one can actively control the wireless power field intensity and orientation at any given point in the defined space. This allows for methods to steer the power transmission towards a specific target at a specific angle.

19 Claims, 17 Drawing Sheets

(51) Int. Cl.
  *H04B 5/00* (2006.01)
  *H02J 50/10* (2016.01)
  *H02J 50/90* (2016.01)
  *G01B 7/30* (2006.01)
  *G01R 19/04* (2006.01)
  *H02J 50/70* (2016.01)
  *H02J 50/80* (2016.01)
  *H01F 5/02* (2006.01)

(52) U.S. Cl.
  CPC .............. *H02J 50/10* (2016.02); *H02J 50/90* (2016.02); *H04B 5/0037* (2013.01); *H04B 5/0087* (2013.01); *H01F 2005/027* (2013.01); *H02J 50/70* (2016.02); *H02J 50/80* (2016.02)

(58) Field of Classification Search
  CPC ... G01R 19/04; H01F 38/14; H01F 2005/027; H04B 5/0087; H04B 5/0037
  See application file for complete search history.

(56) References Cited

OTHER PUBLICATIONS

Examination Report dated Nov. 24, 2017 in European Application No. 15191194.8 (European counterpart of the instant patent application).

\* cited by examiner

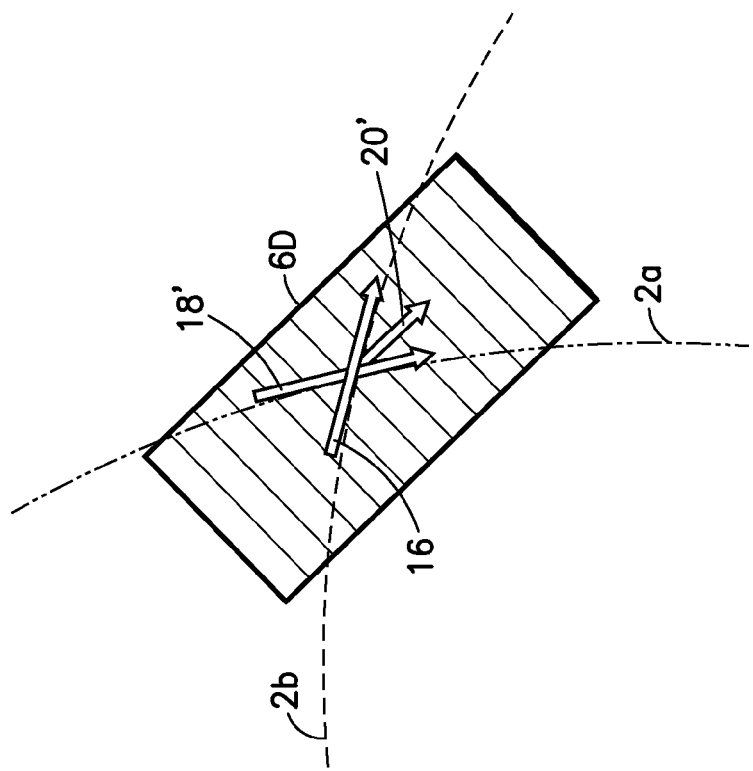
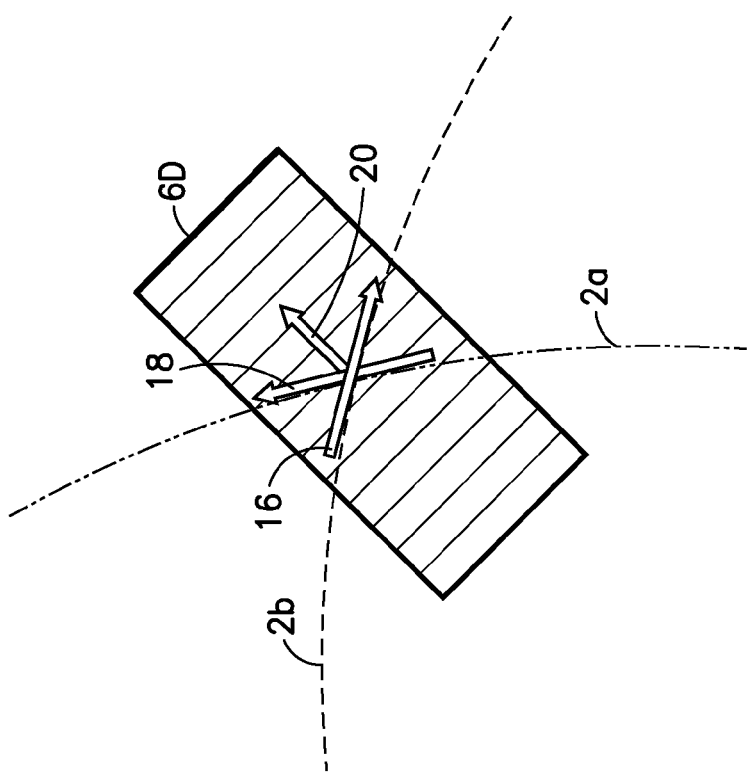

METHODS FOR STEERING A MAGNETIC FIELD FOR SMART WIRELESS POWER TRANSMISSION

BACKGROUND

This disclosure generally relates to systems and methods for wireless power transmission. In particular, this disclosure relates to wireless power transmission by means of resonant inductively coupled transmitters and receivers.

Resonant inductive coupling is the near-field wireless transmission of electrical energy between two coils that are tuned to resonate at the same frequency. Resonant transfer works by making a primary coil ring with an oscillating current, which generates an oscillating magnetic field. A secondary coil in proximity to the primary coil can pick up energy from the oscillating magnetic field. If the primary and secondary coils are resonant at a common frequency, significant power can be transmitted from the primary coil to the secondary coil over a range of a few times the coil diameters at reasonable efficiency.

A known resonant inductive coupling method requires both a resonant frequency match and an orientation match between the transmitter and receiver for significant power transmission to occur. That known method matches frequencies, but because the system has a constant transmitter/receiver relative position and orientation, it does not need to address orientation matching.

In the case of a mobile receiver, the orientation of the mobile receiver relative to the power transmitter can change. However, the mobile receiver, and synonymously the target object in which that receiver is incorporated, must align with the magnetic field line to efficiently receive wireless power. The fact that stationary transmitters produce the same magnetic field limits the spatial freedom of the target object. The target object can change position and orientation to some degree relative to the power transmitters, but the cost is power transmission efficiency.

In the wireless power industry, one strategy has been to place the transmitter on the same plane as the typical desk on which the devices sit. Each device has an internal receiving coil aligned with a magnetic field produced by the transmitter. This allows for efficient charging. However, once the consumer picks up the device to use it, the wireless power link breaks off and the device stops charging. In other words, the availability of this source of power is limited.

In addition, any wireless technology, whether it is data or power transmission, requires interference consideration. A known method of wireless power transmission uses different frequencies (e.g., 44, 62 and 77 kHz) for each of three receivers (e.g., windings) in a motor. Different frequencies were used so that both the magnetic field's frequency and orientation differentiation could be used to minimize crosstalk, or interference, between each of the three phases in the motor. The downside to this approach is that it occupies a frequency band which can result in interference with other surrounding wireless systems.

The problem of crosstalk between phases can be solved by using wider frequency differentiation in addition to orientation differentiation to produce a "double filter". This is an effective approach, but the downside is that the transmitted power occupies a wide frequency band, which can result in interference with other surrounding wireless systems. Another way to view it is, each such system occupies a wide bandwidth, so that few systems can operate in a given volume of space.

An improved method for increasing the spatial freedom of the target object and reducing crosstalk between phases during resonant inductive coupling of power transmitters and receivers is desired.

SUMMARY

The subject matter disclosed herein is directed to systems and methods for mitigating constraints associated with wireless power transmission in applications where the position and orientation of the desired magnetic field changes over time, for example, because the position and orientation of the receiver being powered changes over time or because different receivers having different positions and orientations are being powered at different times. The systems and methods disclosed herein are also applicable in the wireless power transmission industry in general. In accordance with some embodiments disclosed in detail below, the system employs a plurality of wireless power transmitters in a defined space, each consisting of individual coils oriented orthogonally relative to each other. Using field interference amongst these individual coils as well as amongst the transmitters they form, one can actively control the wireless power field intensity and orientation at any given point in the defined space. This allows for methods to steer the power transmission towards a specific target at a specific angle.

The systems and methods disclosed herein provide orientation matching for the purposes of increasing the spatial freedom of a target object (such as a three-phase motor) and reducing crosstalk between phases. In the process, it offers a viable method to improve wireless power transmission in general because orientation has been a challenge in the wireless power transmission industry.

One aspect of the subject matter disclosed in detail below is a method for wirelessly transmitting power to an electric device, comprising: providing a transmitter having at least two transmitter coils arranged at fixed positions and orientations relative to each other; locating the transmitter with respect to a space containing the electric device having a receiver coil; and providing respective electric currents to respective transmitter coils of the transmitter which produce a resultant magnetic field having a magnetic field line which is located along the axis of the receiver coil of the electric device. This method may further comprise: determining an orientation of an axis of the receiver coil of the electric device relative to a frame of reference of the transmitter; and computing amplitudes for the respective electric currents based at least in part on the orientation of the axis of the receiver coil of the electric device.

Another aspect of the subject matter disclosed herein is a system for wireless power transmission comprising: a receiver coil having an axis; first, second and third transmitter coil components having axes which are mutually orthogonal; a computer system programmed to compute respective amplitudes of respective currents to be supplied to the first, second and third transmitter coil components to generate a resultant magnetic field having a magnetic field line which is located along the axis of the receiver coil; and means for supplying the respective currents having the respective amplitudes to the first, second and third transmitter coil components respectively.

A further aspect is a method for wirelessly transmitting power to an electric device, comprising: providing a first transmitter having at least two transmitter coils arranged at fixed positions and orientations relative to each other; providing a second transmitter having at least two transmitter coils arranged at fixed positions and orientations relative to each other; locating the first and second transmitters on different sides of a space containing a first electric device having a receiver coil; and providing respective electric currents to respective transmitter coils of the first and second transmitters which produce a resultant magnetic field having a magnetic field line which is located along the axis of the receiver coil of the electric device. In cases where the space contains a second electric device having a location different than the location of the first electric device, the resultant magnetic field produced may have zero magnetic flux at the location of the second electric device.

Yet another aspect of the subject matter disclosed below is a system for wireless power transmission comprising: a receiver coil having an axis; a gimbal arrangement; a transmitter coil having an axis and mounted to the gimbal arrangement; a first actuator coupled to the gimbal arrangement for changing an azimuth angle of the axis of the transmitter coil; a second actuator coupled to the gimbal arrangement for changing an elevation angle of the axis of the transmitter coil; a computer system (comprising one computer or processor or comprising separate computers or processors) programmed to control the first and second actuators to generate a resultant magnetic field having a magnetic field line which is located along the axis of the receiver coil and programmed to compute an amplitude of current to be supplied to the transmitter coil; and means for supplying said current having said amplitude to the transmitter coil.

Other aspects of systems for wireless power transmission and their methods of operation are disclosed below.

BRIEF DESCRIPTION OF THE DRAWINGS

FIG. 4A is a diagram showing a plan view of a resultant magnetic field aligned with the receiver coil axis when the receiver is oriented as shown in FIG. 4. (FIG. 4A is the same as the inset in FIG. 4.)

FIG. 4B is a diagram showing a plan view of a resultant magnetic field which has been rotated by 90° in order to align with the coil axis of the receiver, which has been rotated by 90°.

FIG. 7 is the analogy to FIG. 4A in three dimensions.

FIG. 10 is the analogy to FIG. 4B in three dimensions.

Reference will hereinafter be made to the drawings in which similar elements in different drawings bear the same reference numerals.

DETAILED DESCRIPTION

U.S. patent application Ser. No. 14/199,272, the disclosure of which is incorporated by reference herein in its entirety, discloses a method for wirelessly controlling and powering a three-phase electric motor using a power transmitter and a controller. The electric motor comprises a plurality of windings and a high-magnetic-permeability core in a rotor. The power transmitter is resonant inductively coupled to the motor windings to drive the motor. Appropriately timed electrical currents in the motor windings cause the core to magnetize and the rotor to move. Mechanical power is obtained from the motor by an appropriate mechanical connection to the rotor. A plurality of power transmitters may be arranged in an appropriate manner to provide power wirelessly to a plurality of electric motors.

Resonant inductive coupling requires both a resonant frequency match and an orientation match between the transmitter and receiver for significant power transmission to occur. U.S. patent application Ser. No. 14/199,272 describes frequency matching and how to achieve it, but because the system it describes has a constant transmitter/receiver relative position and orientation, no means or methods for addressing orientation matching are disclosed. In contrast, the system and method embodiments disclosed in detail below seek to expand applications for wirelessly powered electric motors by addressing orientation matching.

Figure 1:
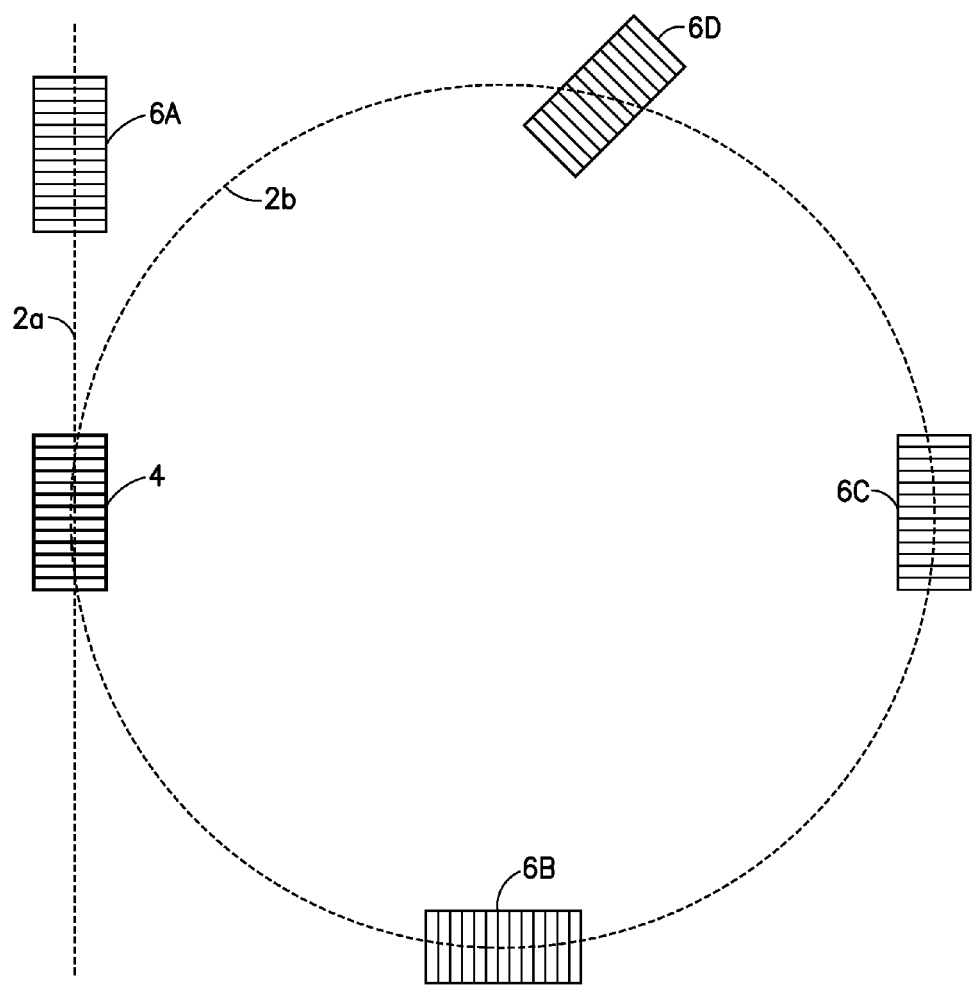
FIG. 1 is a diagram showing a plan view of four receivers and one transmitter arranged in the same plane, some of the receivers being oriented at different angles relative to the transmitter.

FIG. 1 is a diagram showing receiver coils 6A-6D in proximity to a transmitter coil 4. The transmitter coil 4 and each of receiver coils 6A-6D may comprise respective windings of electrically conductive wires and capacitors to create resonant circuits. In the example depicted in FIG. 1, the axes of the transmitter coil 4 and receiver coils 6A-6D are coplanar. The receiver coils 6A-6D have different positions and orientations relative to the transmitter coil 4. The dotted lines 2a and 2b form a simplified partial representation of the magnetic field that the transmitter coil 4 produces when electric current is run through it. Receiver coil 6A can receive wireless power from the transmitter coil 4 because it lies along the magnetic field line 2a that goes through the center axis of the transmitter coil 10. Receiver coils 6B and 6C can both receive power because they lie along the magnetic field line 2b. However, receiver coil 6D receives little to no power because its orientation is mismatched with the magnetic field line 2b. In the case where receiver coil 6D is part of a mobile target object, the axis of receiver coil 6D must align with the magnetic field line 2b to efficiently receive wireless power. This limits the target object's spatial degrees of freedom to three translation and one rotation.

Figure 2:
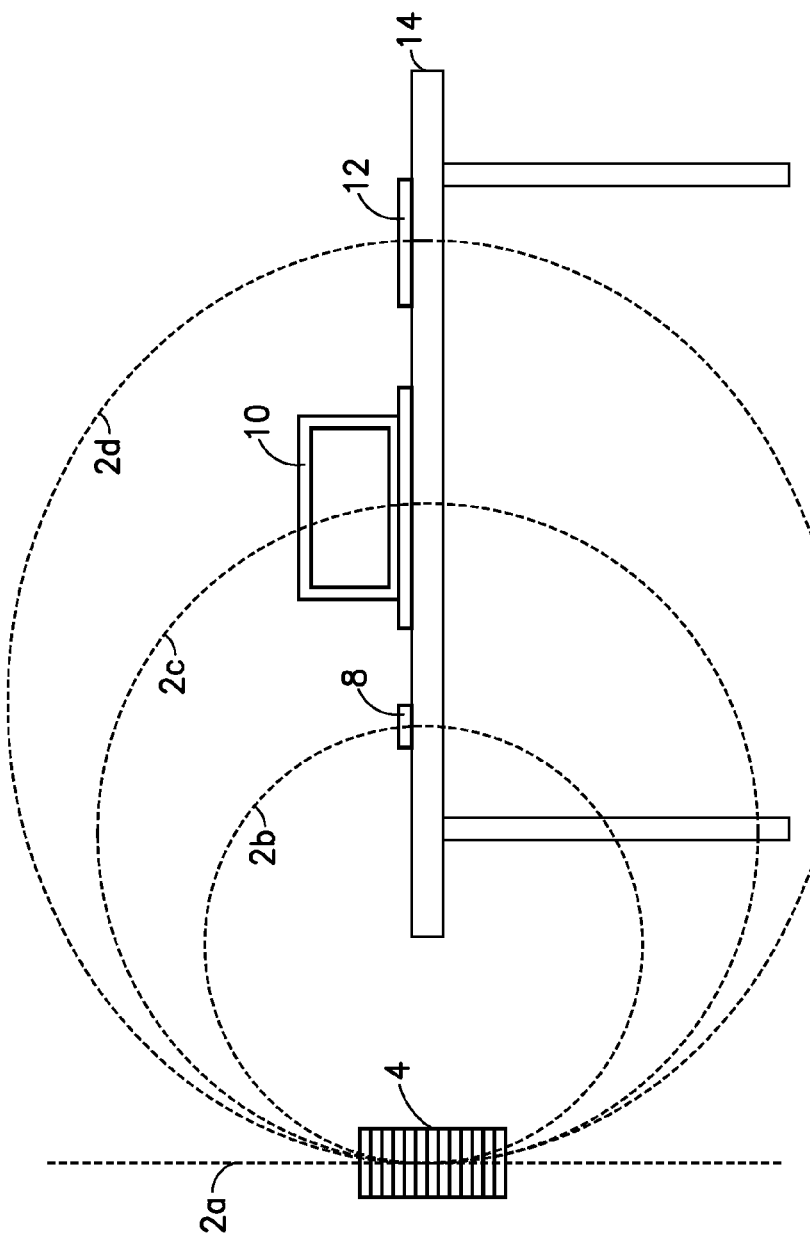
FIG. 2 is a diagram showing an elevation view of a transmitter positioned and oriented for providing wireless charging for consumer electronics in accordance with known technology.

For the wireless power industry in general, one strategy has been to place a transmitter coil 4 on the same plane as the typical desk 14 on which the devices to be wirelessly powered sit, as illustrated in FIG. 2. In this example, the devices to be wirelessly powered include a cell phone 8, a laptop computer 10, and a tablet computer 12. Each device in FIG. 2 has an internal receiver coil (not shown) situated in the same manner as receiver coil 6C in FIG. 1. This allows for efficient charging. However, once the consumer picks up the device to use it, the wireless power link breaks off and the device stops charging.

The systems and methods for orientation matching disclosed in detail hereinafter are grounded in the idea to use transmitter coils arranged orthogonally to each other so that when current is run through them, the transmitter coils generate separate magnetic fields that constructively interfere with each other to create a resultant, desired magnetic field.

Figure 3:
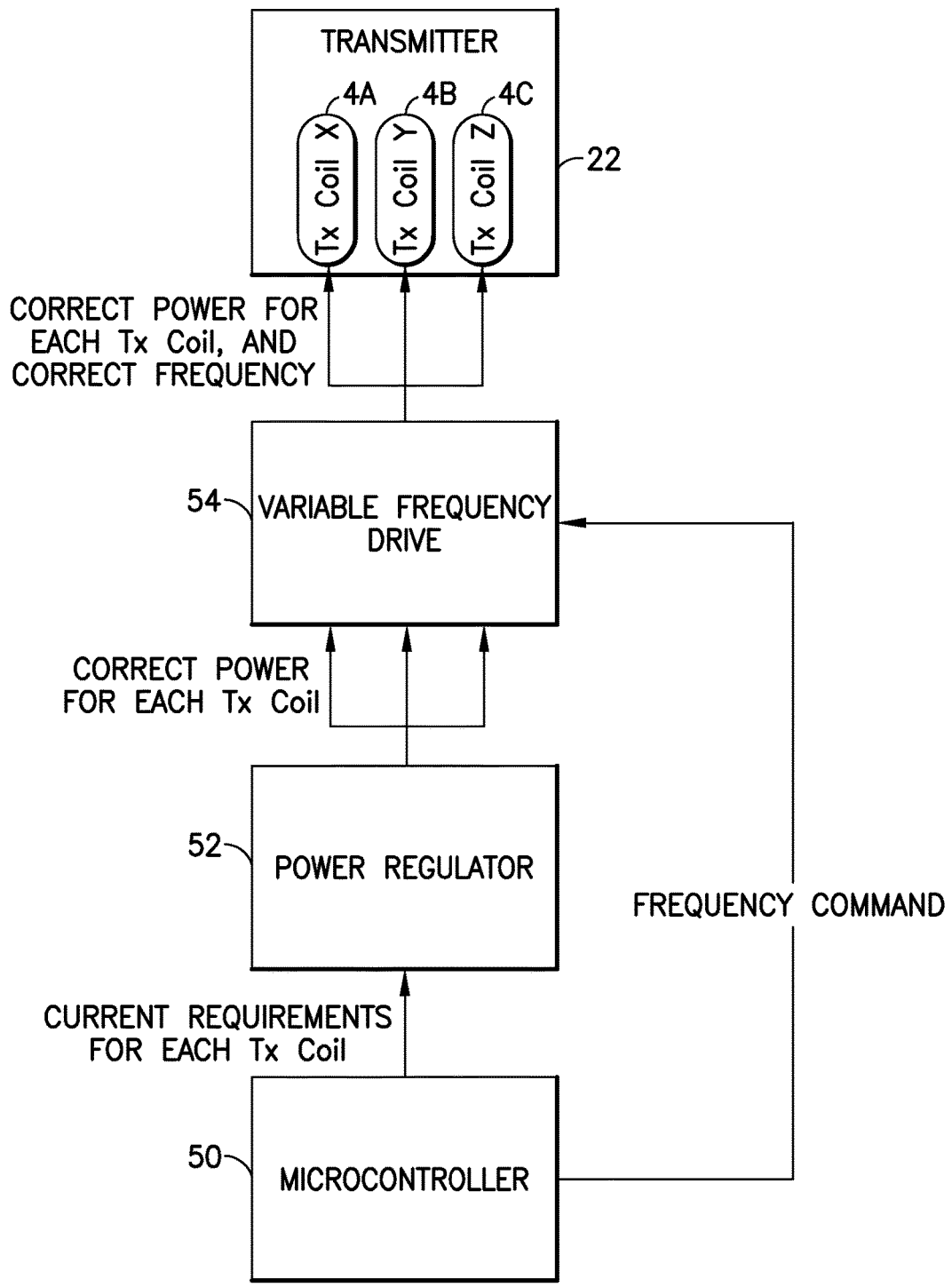
FIG. 3 is a block diagram representing some components of a power transmitter in accordance with some embodiments.

FIG. 3 is a block diagram representing some electronic components of a wireless power transmission system in accordance with some embodiments. This wireless power transmission system comprises a microcontroller 50 which is programmed to make computations for current requirements, etc. The microcontroller 50 then outputs the current requirements (i.e., amplitude) for each transmitter coil to a power regulator 52, which ensures that the power having the correct amplitude will be output to each of three coils 4A, 4B and 4C of a transmitter 22. The microcontroller 50 also outputs frequency commands to a variable frequency drive 54. Based on the current requirements received from the microcontroller 50, the power regulator 52 outputs three different direct currents to the variable frequency drive 54. Based on the frequency commands received from the microcontroller 50, the variable frequency drive 54 converts each direct current into an alternating current with a respective specified frequency.

In accordance with other embodiments, the system may comprise respective variable frequency signal generators for producing small alternating currents of appropriate frequency for each transmitter coil, each variable frequency signal generator being followed by a respective variable power amplifier that amplifies the small currents to larger currents in accordance with the respective amplitudes computed by the computer system.

The system depicted in FIG. 3 is capable of controlling the net magnetic field produced at a specified location by the transmitter coils 4A-4C. The transmitter coils 4A-4C receive respective alternating currents during respective time periods, the amplitudes and phases of these alternating currents being designed to achieve orientation matching of the magnetic field lines with the axis of a receiver coil. In accordance with one embodiment, the transmitter coils 4A-4C are arranged to be mutually orthogonal, so that when alternating current is run through them, the transmitter coils 4A-4C generate separate magnetic fields that constructively interfere with each other to create a resultant, desired magnetic field.

To better understand this concept, this disclosure will discuss the theory first in two-dimensional space and then in three-dimensional space.

Theory in Two-Dimensional Space

Figure 4:
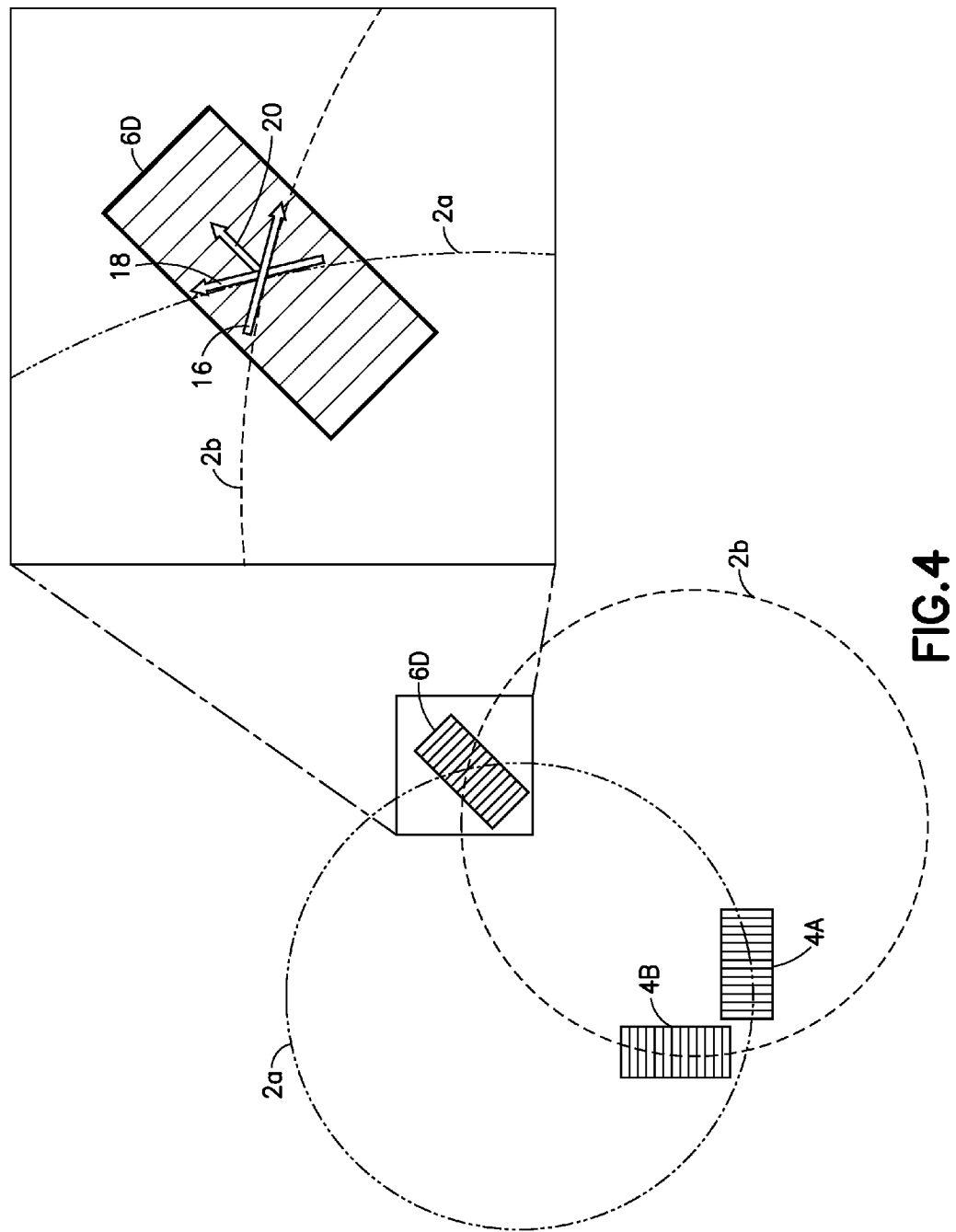
FIG. 4 is a diagram showing a plan view of a two-coil transmitter and a receiver in two-dimensional space. The inset in FIG. 4 provides a magnified view of interfering magnetic fields produced by the transmitters and coupled to a coil or winding in the receiver.

FIG. 4 is a diagram showing a plan view of an arrangement comprising two transmitter coils 4A and 4B and one receiver coil 6D in two-dimensional space. The transmitter coils 4A and 4B are arranged such that their respective axes are orthogonal with respect to each other. The inset in FIG. 4 provides a magnified view of interfering magnetic field lines 2a and 2b produced by transmitter coils 4A and 4B respectively, which magnetic field lines 2a and 2b intersect along the axis of receiver coil 6D.

This arrangement allows the magnetic fields respectively generated by transmitter coils 4A and 4B to interfere with each other, so that at the location (i.e., position plus orientation) of receiver coil 6D, their vector sum will align with the axis of receiver coil 6D. This situation is represented in the magnified inset of FIG. 4 by vectors 16 and 18 (representing the respective magnetic fields at the intersection point) and the vector sum 20, which is aligned with the axis of receiver coil 6D.

In order for the transmitter to steer and regulate the net magnetic field effectively, the microcontroller (not shown in FIG. 4) that controls the transmitter must find the optimal current amplitudes to feed into each transmitter coil and the optimal phase angle, which are determined by the following factors: (1) the position and orientation (i.e., location) of the target receiver coil; (2) unit vectors of each magnetic field intersecting at that location; (3) the amplitude needed for each vector to obtain a desired resultant magnetic field at that location; and (4) the frequency of the oscillating magnetic field.

Position and Orientation

The position and orientation of a mobile target object, having one or more receiver coils or windings (e.g., an electric motor), relative to a fixed transmitter can be determined using any one of the following methods.

A first method for determining receiver coil position and orientation involves using a differential global positioning system (DGPS), ultrasonic sensors, or Vicon cameras (motion capture) to acquire and send position and orientation information to the transmitter controller. These methods would be especially useful for applications where the power transmission must be highly responsive.

A second method for determining receiver coil position and orientation involves searching the physical space in which the target object resides. For each (x, y, z) coordinate in three-dimensional (3-D) space and each ($\theta$, $\varphi$) orientation in 3-D space at these coordinates, create a strong local magnetic field vector. The energy in the transmitter will decrease when the receiver coil receives the power. The controller can use this as a sign that it has found the position and orientation of the receiver coil. Although simple to understand and develop, this method is slow in practice because it involves solving a five-dimensional problem.

A third method for determining receiver coil position and orientation involves searching a parameter space. For all ($P_i$, $P_j$, $P_k$), where P is the power in each coil of a transmitter, find the maximum power received by the receiver coil by sweeping the ratios between ($P_i$, $P_j$, $P_k$) until the controller detects a power drain. This method solves a three-dimensional problem and is thus faster than the second method.

Unit Vectors

Before running this system, a simulation tool can generate and store in a read-only memory look-up table unit vectors of each magnetic field at any given position in a defined space. In two-dimensions, this consists of two vectors for each position. In three dimensions, because there are be three magnetic fields, this consists of three vectors for each position. Alternatively, a more powerful computer can calculate the unit vectors in real-time, although it must reach the result within the short amount of time required for this step.

Amplitude

Once the microcontroller or computer knows the position, orientation and unit vectors, it can then determine the amplitude required to multiply each unit vector in order to achieve the desired field orientation and intensity. For example, if the receiver coil 6D in FIG. 4A were rotated 90° (as shown in FIG. 4B), the system will determine that the amplitude of the unit vector 18 in FIG. 4A needs to be multiplied by −1 to form a new vector 18'. New vector 18', when summed with vector 16, would form the new vector 20' which is aligned with the axis of the rotated receiver coil 6D as seen in FIG. 4B. Similarly, if the microcontroller 50 (see FIG. 3) decides to further rotate the resultant magnetic field by another few degrees, it would command the power regulator 52 to weaken the magnetic field generated by transmitter coil 4B and strengthen the magnetic field generated by transmitter coil 4A.

Frequency

Before discussing three-dimensional space, it may be instructive to review an important concept from resonant inductive coupling. For simplicity purposes, the diagrams in this disclosure illustrate DC magnetic fields. In practice, the fields must be AC at frequency f for efficient wireless power transmission to occur. Therefore, when this disclosure stated earlier that "the amplitude of the unit vector 18 . . . needs to be multiplied by −1," in practice one would add a phase shift of 180° to the carrier current of frequency f before this phase-shifted AC current is fed into the transmitter coil 4A. For a three-phase electric motor which is wirelessly powered using respective resonant frequencies, one would select the correct frequency f depending on which phase is currently in effect.

On the topic of commutating a three-phase electric motor which is wirelessly powered using respective resonant frequencies, one can use the same method disclosed in U.S. patent application Ser. No. 14/199,272 to find the rotor information such as position, direction of rotation and speed. This will indicate when to send power to which receiver coil (stator). One can then overlay the orientation matching method disclosed herein to ensure that the magnetic field is steered towards that receiver coil.

Figure 5:
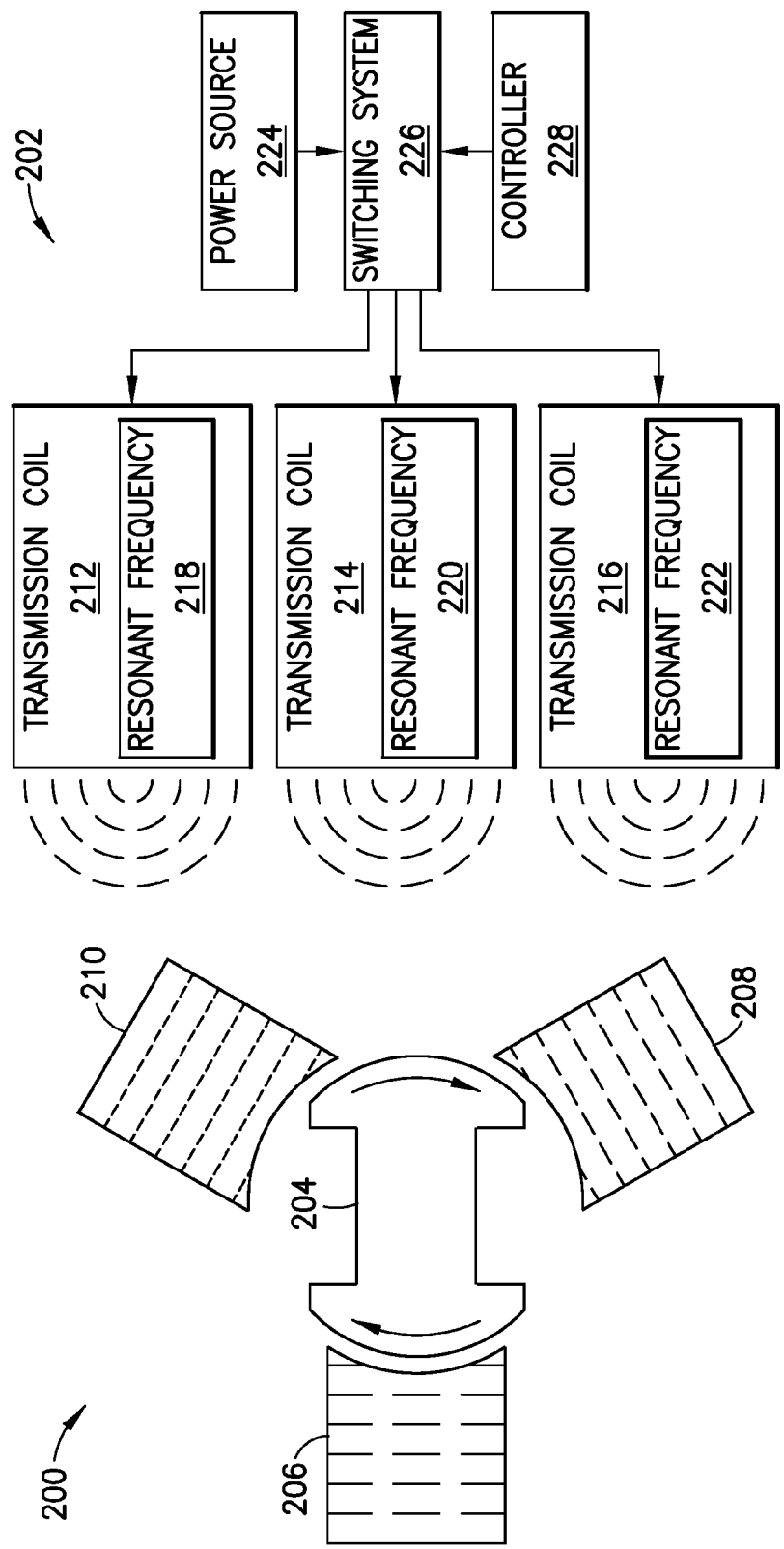
FIG. 5 is a diagram showing some components of a system for wirelessly controlling and powering a three-phase electric motor in accordance with an embodiment disclosed in U.S. patent application Ser. No. 14/199,272.

FIG. 5 is a diagram showing some components of a system for wirelessly controlling and powering an electric motor in accordance with an embodiment disclosed in U.S. patent application Ser. No. 14/199,272. In this example, power is provided to a three-phase electric motor 200 wirelessly by a power transmitter 202. In other embodiments, the power transmitter 202 may be designed to provide power wirelessly to electric motors having any other number of phases.

As seen in FIG. 5, electric motor 200 comprises a rotor 204, a first winding 206, a second winding 208, and a third winding 210. Windings 206, 208 and 210 are configured to have different resonant frequencies respectively referred to hereinafter as first, second and third resonant frequencies.

The power transmitter 202 comprises a first transmission coil 212, a second transmission coil 214, and a third transmission coil 216. Transmission coils 212, 214 and 216 are configured to have different resonant frequencies corresponding to the resonant frequencies of windings 206, 208 and 210. For example, transmission coil 212 may have resonant frequency 218 corresponding to the first resonant frequency of winding 206; transmission coil 214 may have resonant frequency 220 corresponding to the second resonant frequency of winding 208; and transmission coil 216 may have resonant frequency 222 corresponding to the third resonant frequency of winding 210.

Electrical power may be provided to transmission coils 212, 214 and 216 from a power source 224 via switching system 226. To operate electric motor 200, current is sent through each of windings 206, 208 and 210 in an appropriate sequence to make rotor 204 turn. A controller 228 is configured to determine which one of windings 206, 208 and 210 should be provided with power at any point in the sequence. Controller 228 may operate switching devices in switching system 226 to provide power from power source 224 to each one of transmission coils 212, 214 and 216 in the appropriate sequence. In turn, each of transmission coils 212, 214 and 216 induces a change in magnetic flux at corresponding resonant frequencies 218, 220 and 222. These changes in magnetic flux at resonant frequencies 218, 220 and 222 in the appropriate sequence induce the desired currents in windings 206, 208 and 210 in the appropriate sequence to turn rotor 204. Because windings 206, 208 and 210 have different resonant frequencies, the transmission of power from power transmitter 202 at one of resonant frequencies 218, 220 or 222 will only induce current in the one of windings 206, 208 or 210 having the corresponding resonant frequency. This allows power to be provided to each of windings 206, 208 and 210 individually in the appropriate sequence.

U.S. patent application Ser. No. 14/199,272 further discloses means for determining the angular position of rotor 204 relative to the windings 206, 208 and 210 of electric motor 200. For example, the total inductance of the transmission coils 212, 214 and 216 may change as the angular position of rotor 204 changes. The position, direction of rotation and speed of rotor 204 can be determined by detecting the effect on the total inductance of the transmission coils produced by rotor movement. This information can be used by the controller to determine when to send power to which winding. The orientation matching method disclosed herein can then be employed to ensure that the net magnetic field is steered towards that winding. Below are steps to do so, generalized for motor designs with any number of windings (i.e., stators):

(1) Predetermine a "marker" winding thereafter designated Rx1 with frequency $f_1$.

(2) Find the position and orientation of Rx1 using an AC magnetic field with frequency $f_1$. Any of the previously mentioned methods would work.

(3) Since the design of the motor is known, the angle θ between Rx1 and the next winding is known. Now one need only sweep angle φ to lock down the 3-D position and orientation of the next winding. The result is a 2-D plane.

(4) For the position and orientation found in Step (3), try out frequencies $f_2$ and $f_n$ (where n is the number of windings in the motor design) to determine if this winding is Rx2 or Rxn (the last winding).

(5) Since all windings in the motor are arranged on a 2-D plane, one can easily calculate the position and orientation of the remaining windings from position and orientation of Rx1.

Illustrations in Three-Dimensional Space

Figure 6:
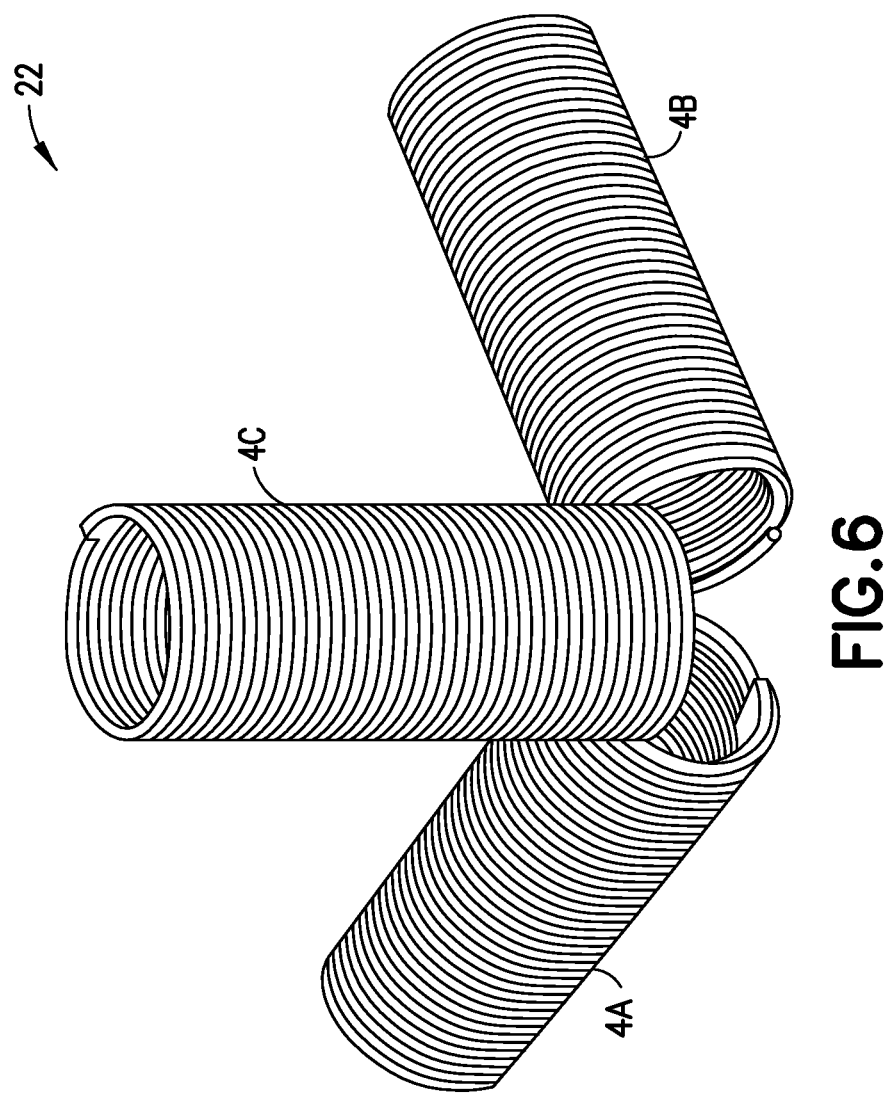
FIG. 6 is a diagram showing an isometric view of three mutually orthogonal coils of a power transmitter in accordance with one embodiment.

FIG. 6 is an isometric view of three mutually orthogonal coils 4A-4C of a power transmitter 22 in accordance with one embodiment. Other components of the transmitter, such as capacitors and oscillators are not shown. Each coil comprises an electrical conductor wound in the same direction, the axes of coils 4A-4C being oriented orthogonal to each other. As varying amounts of current are passed through coils 4A-4C, they generate magnetic fields of varying intensity and direction. According to calculations, the magnetic fields generated by any two coils will always be oriented more than 53° away from each other in the far field. This means that at any given point in space, a vector summation can be used to arrive at a desired resultant magnetic field intensity and orientation. Another explanation is that each coil acts as a dipole, which is a vector. The superposition of three vectors (with varying amplitudes) allows the resulting total dipole vector to be pointed in any direction.

Figure 7:
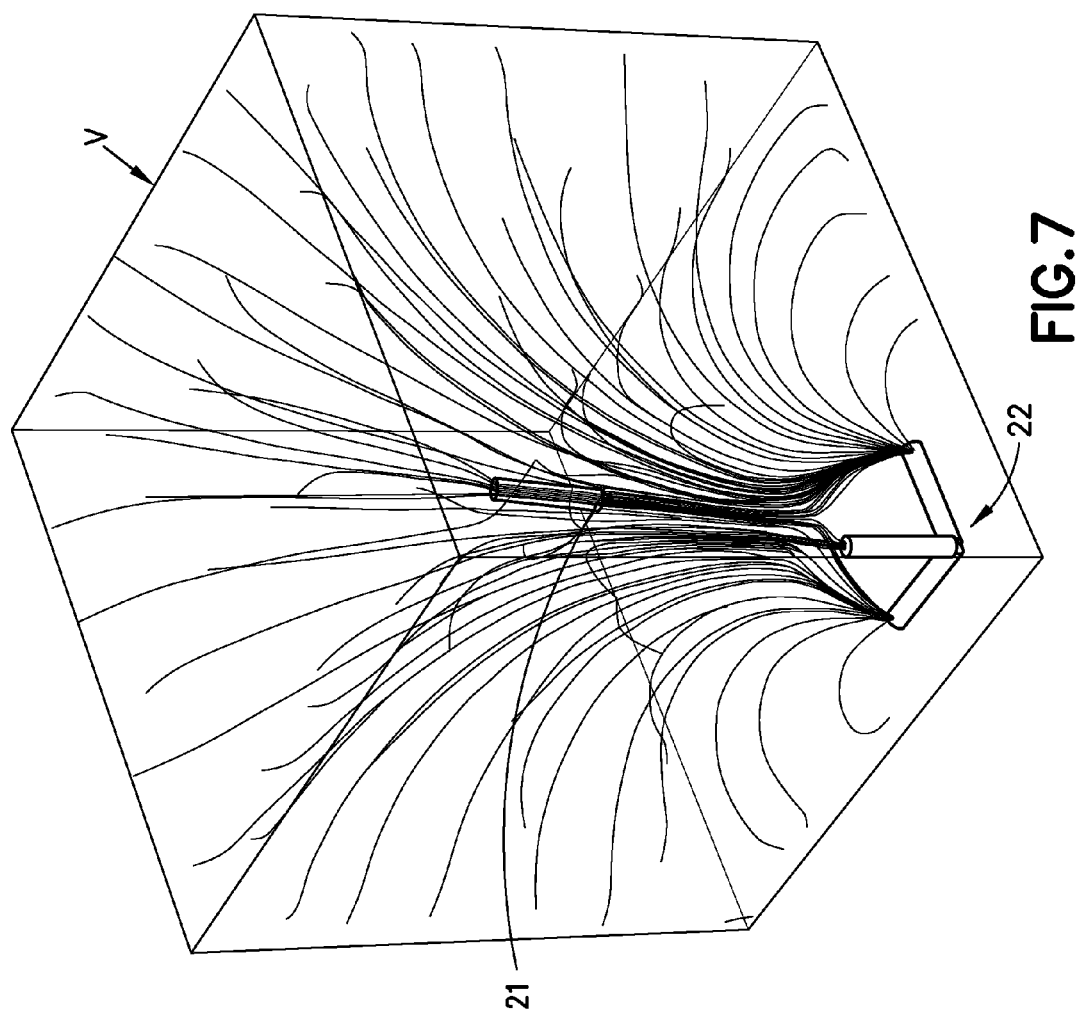
FIG. 7 is a diagram representing an isometric view of a defined space in which magnetic field lines are being generated by three mutually orthogonal transmitter coils having a target receiver coil in the middle of the defined space.

The analogy to FIG. 4A in three dimensions is shown in FIG. 7, which provides an isometric view of a defined space V (in this example, a cube) in which magnetic field lines are being generated by three mutually orthogonal transmitter coils of a transmitter 22. A target receiver coil 21 is disposed in the middle of the defined space V. The axis of receiver coil 21 in this example is collinear with a diagonal of the defined space V. Each of the transmitters coils, which have axes in the X, Y and Z directions respectively, are running on equal currents ($i_x=i_y=i_z$). The major resultant magnetic field line thus points towards the diagonally opposite corner of the defined space V. This is exactly the orientation which will maximize the power delivered to receiver coil 21.

Still referring to FIG. 7, one can also use the secondary magnetic field lines, that is, the lines that are more curved, to transmit power. These lines are usually less than one-half the strength of the polar, straighter line. In addition, the calculations for using secondary magnetic field lines to transmit power become more complicated. Nevertheless, it is a possibility that can be useful when there are many receivers (i.e., target objects) in the defined space.

To create an even stronger magnetic field at the target object, one can install more transmitters in the defined space V. FIGS. 8 through 11 demonstrate one such arrangement in which a pair of power transmitters 22 and 24 are disposed in diagonally opposite corners of a cubic defined space V. The placement of multiple transmitters (each having two or more transmitter coils) in the defined space V can be optimized by the most common position and orientation of the intended target object. It should be appreciated, however, that the capabilities demonstrated in FIGS. 8-11 can be accomplished using just a single three-coil transmitter.

Figure 8:
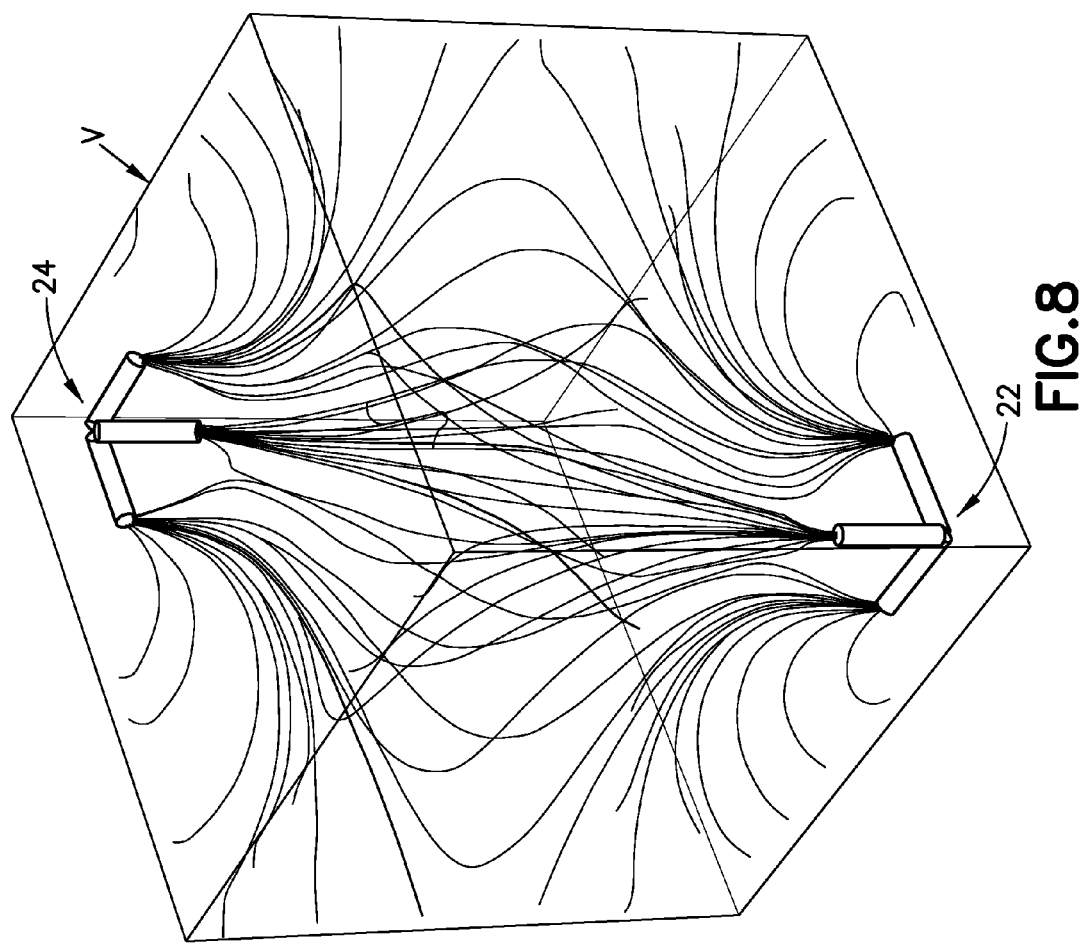
FIG. 8 is a diagram representing an isometric view of a defined space in which magnetic field lines are being generated by two sets of mutually orthogonal transmitter coils placed and operated such that the magnetic field within the defined space is strengthened by constructive interference.

FIG. 8 is an isometric view of a defined space V in which magnetic field lines are being generated by two transmitters 22 and 24, each comprising a set of three mutually orthogonal coils, placed at diagonally opposite corners of the defined space V and operated such that the magnetic field within the defined space V is strengthened by constructive interference.

Figure 9:
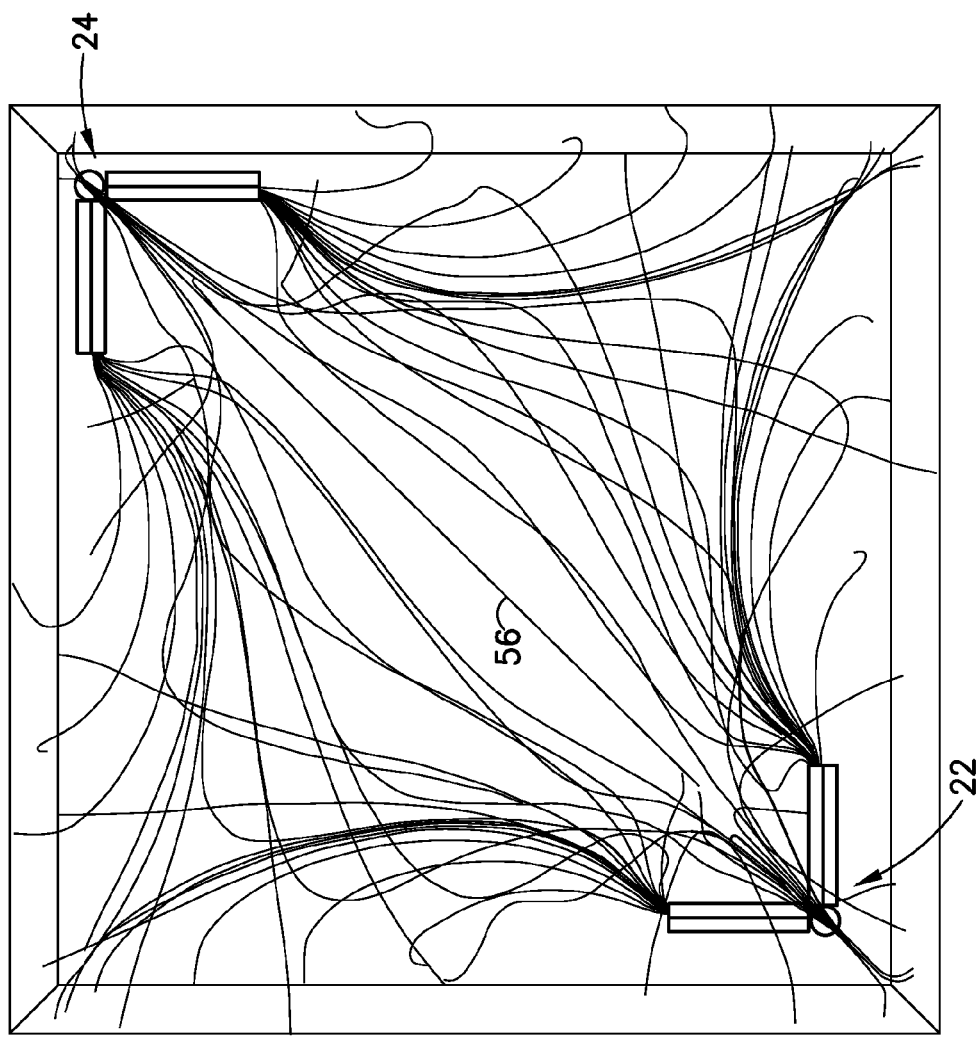
FIG. 9 is a diagram representing an X-Y plane view of the magnetic field lines depicted in FIG. 8.

FIG. 9 is an X-Y plane view of the magnetic field lines depicted in FIG. 8. The magnetic field line 56 is disposed along a diagonal of the defined space V.

Figure 10:
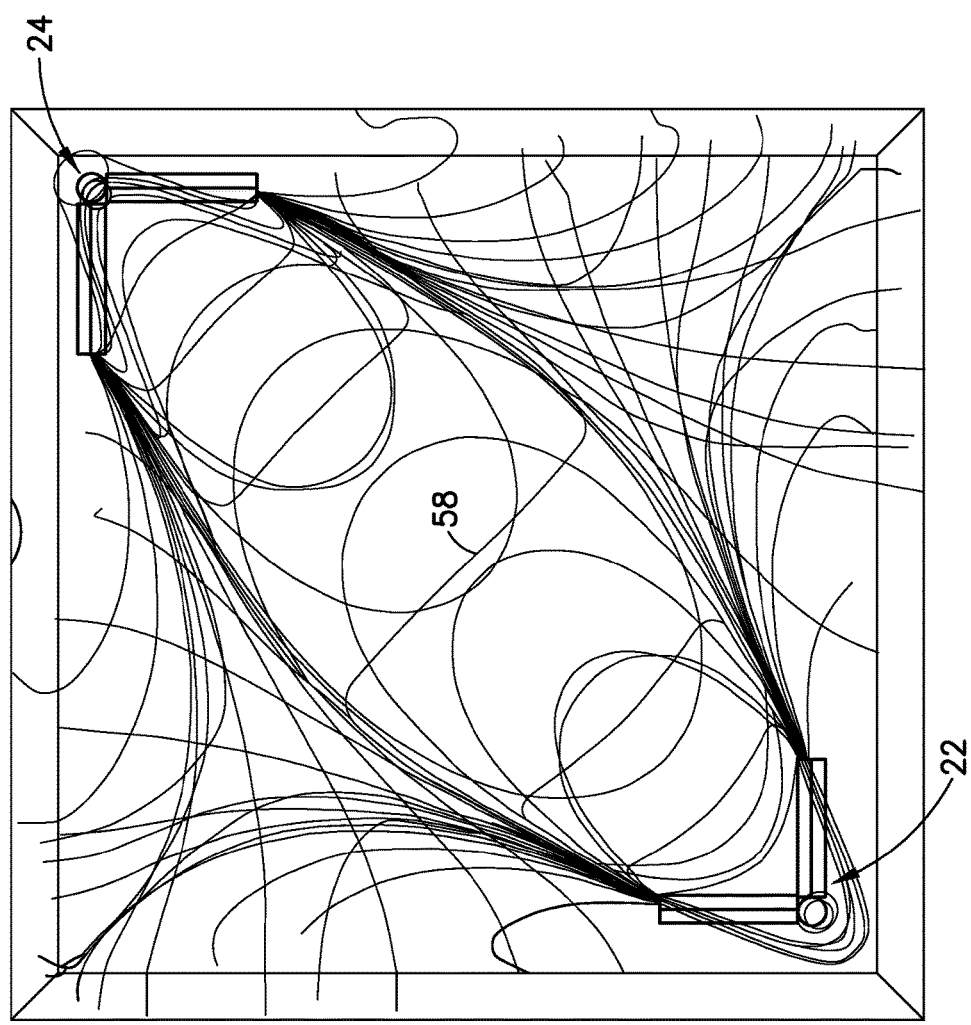
FIG. 10 is a diagram representing an X-Y plane view of the magnetic field lines produced when the Z-axis coils of two transmitters are turned off, the X-axis coils are turned on, and the Y-axis coils are turned on with a 180° phase shift relative to the X-axis coils.

FIG. 10 is an X-Y plane view of the magnetic field lines produced when the Z-axis coils of transmitters 22 and 24 are turned off, the X-axis coils are turned on, and the Y-axis coils are turned on with a 180° phase shift relative to the X-axis coils. FIG. 10 is the analogy to FIG. 4B in three dimensions. The result is a magnetic field line 58 which has been rotated by 90° relative to the diagonal magnetic field line 56 seen in FIG. 9.

Figure 11:
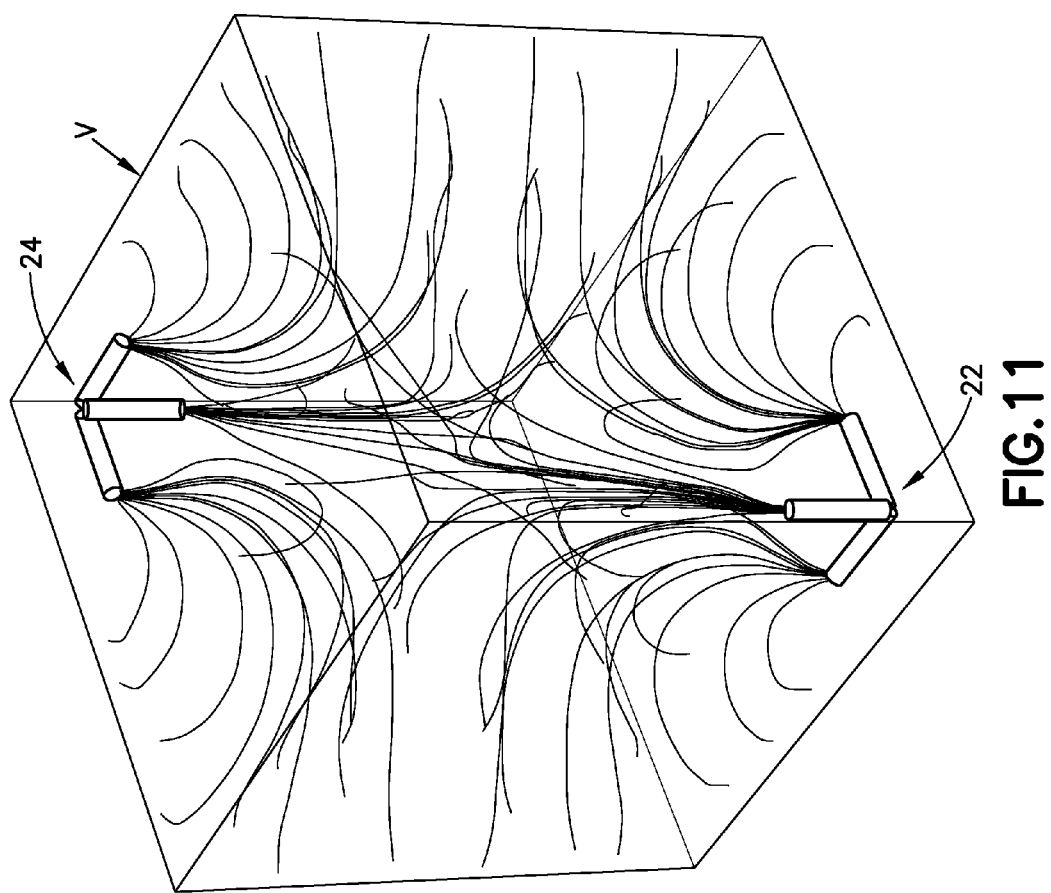
FIG. 11 is a diagram representing an isometric view of a defined space in which magnetic field lines are being generated by two sets of mutually orthogonal transmitter coils placed and operated such that the magnetic field has an area within the defined space in which the magnetic flux is zero due to destructive interference.

FIG. 11 is an isometric view of a defined space V in which magnetic field lines are being generated by two transmitters 22 and 24 placed and operated such that the resultant magnetic field has an area within the defined space V in which the magnetic flux is zero due to destructive interference. FIG. 11 demonstrates something that a single transmitter cannot accomplish: black spotting. In the situation depicted in FIG. 11, the pair of transmitters 22 and 24 oppose each other, thus generating an area in the middle that has zero magnetic flux due to destructive interference. This area is called a "black spot" because a receiver coil disposed in this area receives no power, while a receiver in any other spot can receive power. The black spot can be displaced along a diagonal line by simply varying the intensity of one transmitter Tx1 relative to another transmitter Tx2 (e.g., the intensity of Tx1 flux gets stronger with decreasing distance from Tx1 while the intensity of Tx2 flux gets weaker, and vice versa). Generally, one can use the same algorithm as the one described above, but adapted to compute amplitudes and phase angles that will produce black spotting when currents are supplied to the transmitter coils: (1) determine the location of the target receiver coil; (2) compute the unit vectors of each magnetic field intersecting at that location for the plurality of transmitters; and (3) compute the amplitudes for each vector that will produce zero flux at that location.

In accordance with an alternative embodiment, a black spot for a wirelessly powered motor can be created by ensuring that at the specified location, a magnetic field is created that is not aligned with the axis of the target receiver coil. This method also works with some energy-draining objects.

In accordance with another embodiment, a mathematical method can be applied for computing transmitter current amplitudes and phase angles for powering a device at one location while creating a black spot at another location. This concept will be explained with reference to FIG. 12, which shows a defined space V in which two transmitters 22, 24 and two receivers 23, 25 are disposed. Each transmitter 22, 24 comprises three mutually orthogonal coils; each receiver 23, 25 comprises a single receiver coil.

Figure 12:
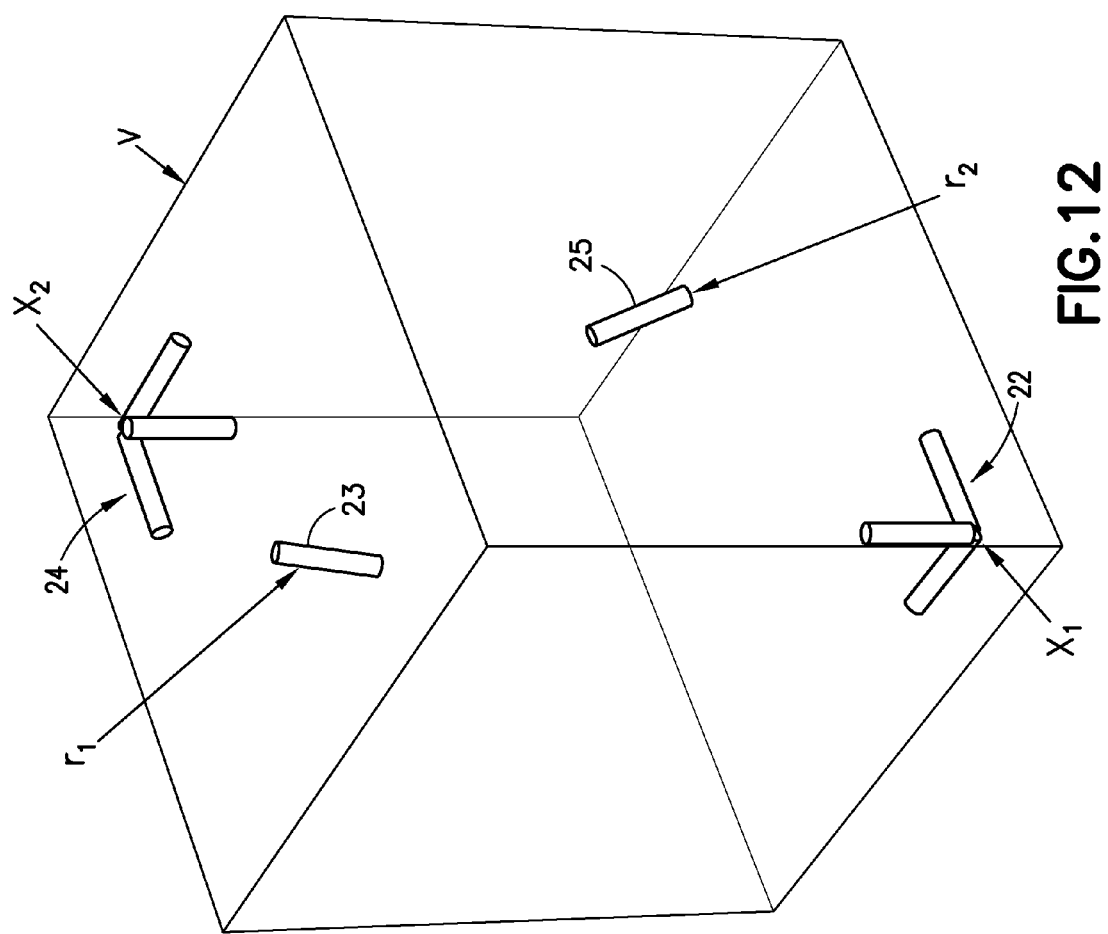
FIG. 12 is a diagram showing an isometric view of a defined space having two transmitters and two receivers located therein, each transmitter comprising three mutually orthogonal coils and each receiver comprising a single coil.

In the situation depicted in FIG. 12, transmitter 22 is at location $x_1$ and transmitter 24 is at location $x_2$. (Bold font indicates a vector.) Each transmitter acts as a magnetic dipole, $m_1$ or $m_2$, with variable amplitude and direction. One can describe each dipole as the sum of three orthogonal dipole vectors, e.g.:

$$m_1 = \hat{i} \, m_{x1} + \hat{j} \, m_{y1} + \hat{k} \, m_{z1}. \quad (1)$$

In a typical embodiment, one can control the values $m_{x1}$, $m_{y1}$, and $m_{z1}$ by choosing the current that flows through each coil of the transmitter.

In the situation shown in FIG. 12, assume a location $r_1$ where a magnetic field $B_A$ is desired, typically to power a receiver. Assume there is also a location $r_2$ where one wishes to produce a magnetic field $B_B$. Since the magnetic fields at $r_1$ and $r_2$ are the sum of magnetic field vectors from the two transmitter dipoles, we can describe the desired magnetic fields as follows:

$$B(r_1)=B_A=B_1(r_1)+B_2(r_1) \quad (2)$$

and $$B(r_2)=B_B=B_1(r_2)+B_2(r_2) \quad (3)$$

where fields $B_1$ and $B_2$ are respectively produced by dipoles $m_1$ and $m_2$. These magnetic fields can be calculated as follows:

$$B(r_1)=f(m_1,r_1-x_1)+f(m_2,r_1-x_2) \quad (4)$$

$$B(r_2)=f(m_1,r_2-x_1)+f(m_2,r_2-x_2) \quad (5)$$

where f(m, r) is a function that computes the magnetic field vector at a location r relative to a dipole m:

$$f(m,r) = \frac{\mu_0}{4\pi}\left(\frac{3r(m*r)}{r^5} - \frac{m}{r^3}\right) \quad (6)$$

Magnetic field strength from any dipole is linearly proportional to the dipole magnitude, so Eqs. (4) and (5) can be expanded to show each magnetic field component as a linear combination of the dipole components:

$$B_{Ax}(r1)=a_{11}m_{1x}+a_{12}m_{1y}+a_{13}m_{1z}+a_{14}m_{2x}+a_{15}m_{2y}+a_{16}m_{2z}$$

$$B_{Ay}(r1)=a_{21}m_{1x}+a_{22}m_{1y}+a_{23}m_{1z}+a_{24}m_{2x}+a_{25}m_{2y}+a_{26}m_{2z}$$

$$B_{Az}(r1)=a_{31}m_{1x}+a_{32}m_{1y}+a_{33}m_{1z}+a_{34}m_{2x}+a_{35}m_{2y}+a_{36}m_{2z}$$

$$B_{Bx}(r2)=a_{41}m_{1x}+a_{42}m_{1y}+a_{43}m_{1z}+a_{44}m_{2x}+a_{45}m_{2y}+a_{46}m_{2z}$$

$$B_{By}(r2)=a_{51}m_{1x}+a_{52}m_{1y}+a_{53}m_{1z}+a_{54}m_{2x}+a_{55}m_{2y}+a_{56}m_{2z}$$

$$B_{Bz}(r2)=a_{61}m_{1x}+a_{62}m_{1y}+a_{63}m_{1z}+a_{64}m_{2x}+a_{65}m_{2y}+a_{66}m_{2z} \quad (6)$$

where the matrix coefficients $a_{11}$, $a_{12}$, etc., are computed from function f. (Computing function f is relatively simple if the computation uses a coordinate system with the origin at the center of dipole m and the z-axis parallel to the dipole vector. Then, given the "dipole latitude", i.e., 90° minus the angle between m and r, one can store a set of dimensionless field intensities, look them up as needed, and scale them in proportion to $m/r^3$ to get the actual field value, B(r).)

There are six equations with six unknowns: the dipole components $m_{1x}$, $m_{1y}$, $m_{1z}$, $m_{2x}$, $m_{2y}$, and $m_{2z}$. Therefore Eqs. (7) can be solved to find the dipole values. If one sets $B_B=0$, then one can find the magnetic dipole values that drive a device at location $r_1$ while putting zero magnetic field (i.e., a black spot) at location $r_2$. Knowing the coil parameters (e.g., coil diameter, coil length, number of turns, permeability of any high-permeability material), one can compute the electric current needed to produce those magnetic dipole values.

The example shown in FIG. 12 assumes that the system designer wants to specify all three magnetic field components at each of two locations. In some embodiments, the system designer would rather specify one magnetic field component at each of two or three locations. For example, a work area may contain one or more flat sheets of conductive material. The system designer may want the magnetic field perpendicular to the surface to be zero so that no eddy currents are induced. As before, assume a location $r_1$ where a magnetic field $B_A$ is desired for the purpose of powering some device. Unlike before, in this example the goal is for the magnetic field to have a zero component in various directions $v_i$ at three locations $r_i$: in direction v2 at location r2, in direction v3 at location r3, and in direction v4 at location r4. This set of conditions can be written as:

$$B_{Ax}(r1)=a_{11}m_{1x}+a_{12}m_{1y}+a_{13}m_{1z}+a_{14}m_{2x}+a_{15}m_{2y}+a_{16}m_{2z}$$

$$B_{Ay}(r1)=a_{21}m_{1x}+a_{22}m_{1y}+a_{23}m_{1z}+a_{24}m_{2x}+a_{25}m_{2y}+a_{26}m_{2z}$$

$$B_{Az}(r1)=a_{31}m_{1x}+a_{32}m_{1y}+a_{33}m_{1z}+a_{34}m_{2x}+a_{35}M_{2y}+a_{36}m_{2z}$$

$$B_{v2}(r2)=b_{41}m_{1x}+b_{42}m_{1y}+b_{43}m_{1z}+b_{44}m_{2x}+b_{45}m_{2y}+b_{46}m_{2z}$$

$$B_{v3}(r3)=c_{51}m_{1x}+c_{52}m_{1y}+c_{53}m_{1z}+c_{54}m_{2x}+c_{55}m_{2y}+c_{56}m_{2z}$$

$$B_{v4}(r4)=d_{61}m_{1x}+d_{62}m_{1y}+d_{63}m_{1z}+d_{64}m_{2x}+d_{65}m_{2y}+d_{66}m_{2z} \quad (7)$$

where $B_{vi}$ is the magnetic field component in the $v_i$ direction, and where coefficients $b_{mn}$, $c_{mn}$ and $d_{mn}$ are computed from function f and are, in general, different than $a_{mn}$. In this example, set each of the $B_{vi}=0$.

For other applications, one might set those $B_{vi}$ to different values. One can control the magnetic field in chosen directions $v_i$ at each of six positions, provided that the field components perpendicular to $v_i$ at each position are of no concern. Since resonant inductive coupling depends on the magnetic field strength parallel to the axis of the receive coil, two 3-D transmitters can power up to six devices. (And one 3-D transmitter can power three devices, or two devices and one black spot, or vice versa.) There are practical limits to how much current each transmit coil can handle and how close differently oriented receiver coils can be to each other, but the mathematics is quite general.

Alternate Embodiments

Besides using multiple transmitters in a defined space to more effectively deliver energy to a target, other alternate embodiments are within the scope of the broad concept disclosed herein.

Figure 13:
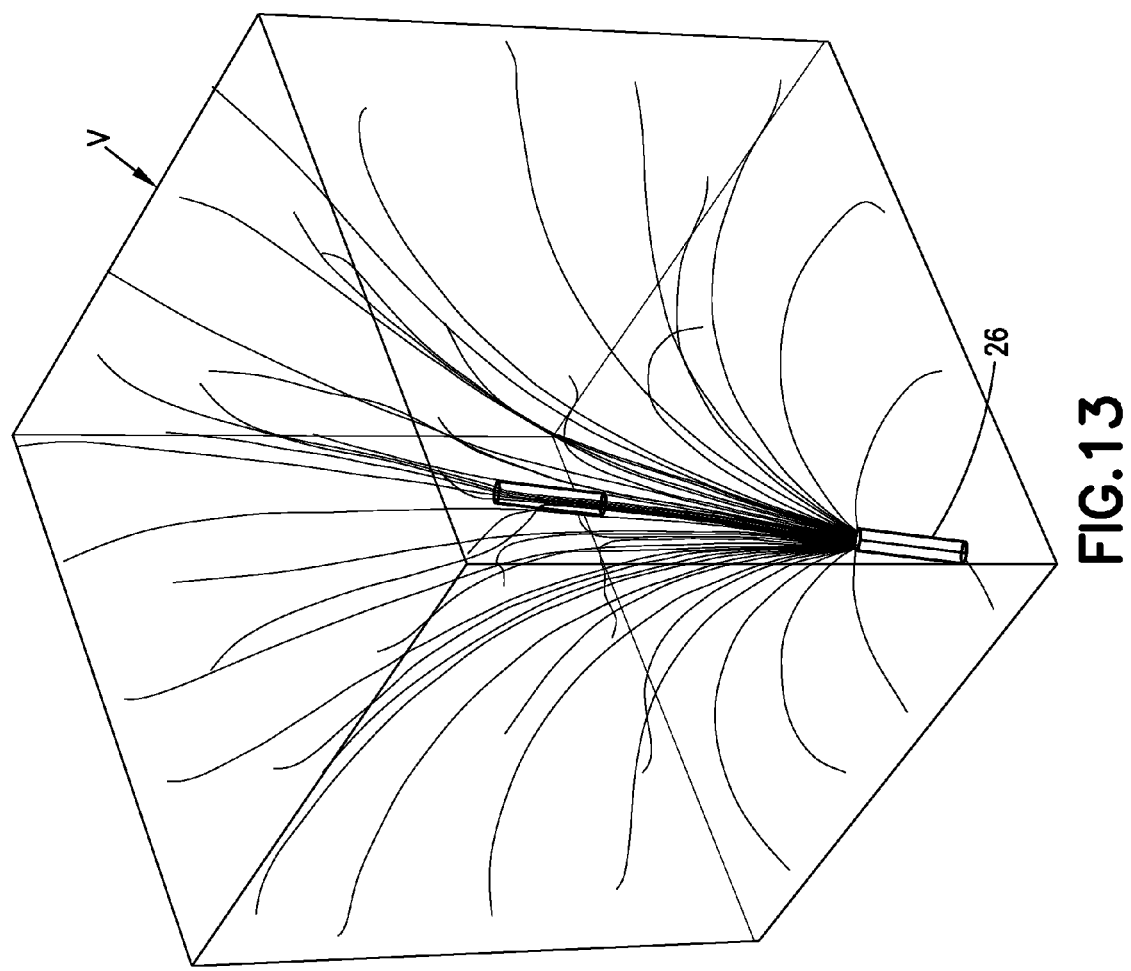
FIG. 13 is a diagram representing an isometric view of a defined space in which magnetic field lines are being generated by a single transmitter coil mounted on a mechanical device to change the orientation of the transmitter coil.
Figure 14:
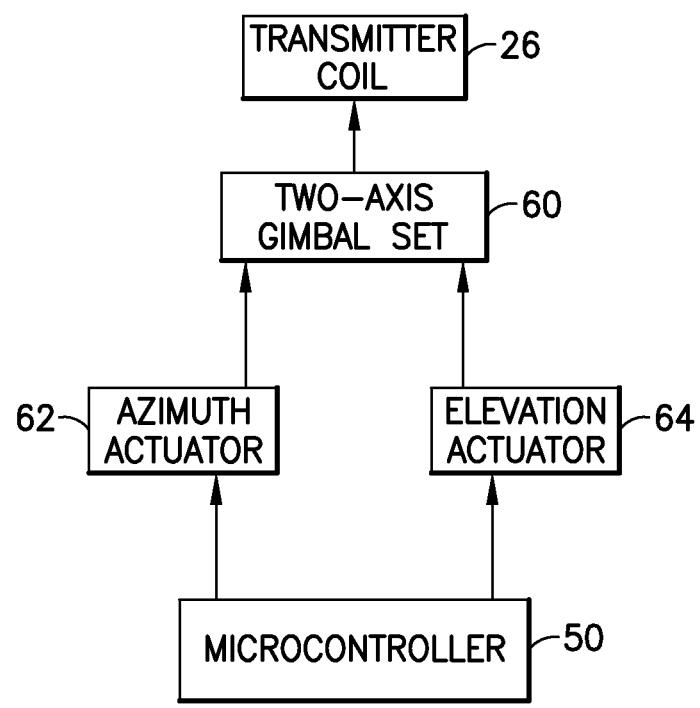
FIG. 14 is a block diagram showing components of an actuated transmitter coil system in accordance with an alternate embodiment.

The embodiments discussed thus far use magnetic field interference to direct the magnetic field. In alternate embodiments, the magnetic field can be directed to a desired location by mechanically aiming a single coil to produce the correct field orientation at the target. FIG. 13 is an isometric view of a defined space V in which magnetic field lines are being generated by a single transmitter coil 26 mounted on a mechanical device (not shown in FIG. 13) to change the orientation of the transmitter coil 26. As depicted in FIG. 14, the mechanical device may comprise a two-axis gimbal set 60 in which the azimuth and elevation angles of the transmitter coil 26 can be varied using respective actuators 62 and 64. The operation of actuators 62 and 64 can be controlled by the microcontroller 50 in dependence on the azimuth and elevation angles of the transmitter coil 26, which can be computed by the microcontroller 50 based on the location of the electric device to be wirelessly powered.

The actuated transmitter coil system depicted in FIGS. 13 and 14 requires actuators that work in unison, and may increase component and maintenance cost. However, it may be useful in applications where magnetic interference is not an option, or when the transmitter coil is heavy but the actuator system is lightweight. To drive a fairly powerful three-phase electric motor at long range, each of the three transmitter coils (see FIG. 6) would have to be fairly large and heavy. If the motor application does not require that the power transmitter re-orient the magnetic fields very quickly or work under high gravitational forces, one could steer one transmitter coil with a couple of one-ounce actuators.

The three-coil transmitter 22 depicted in FIG. 6 is useful for explaining the use of resonant inductive coupling for wirelessly powering electric devices, but it is not the optimal design because it does not represent a single steerable dipole. This means that the closer the receiver gets to the transmitter 22, the less straightforward the control is. In fact, this can be seen in FIG. 7, which includes an unintentional, inherent black spot close to the transmitter 22.

Figure 15:
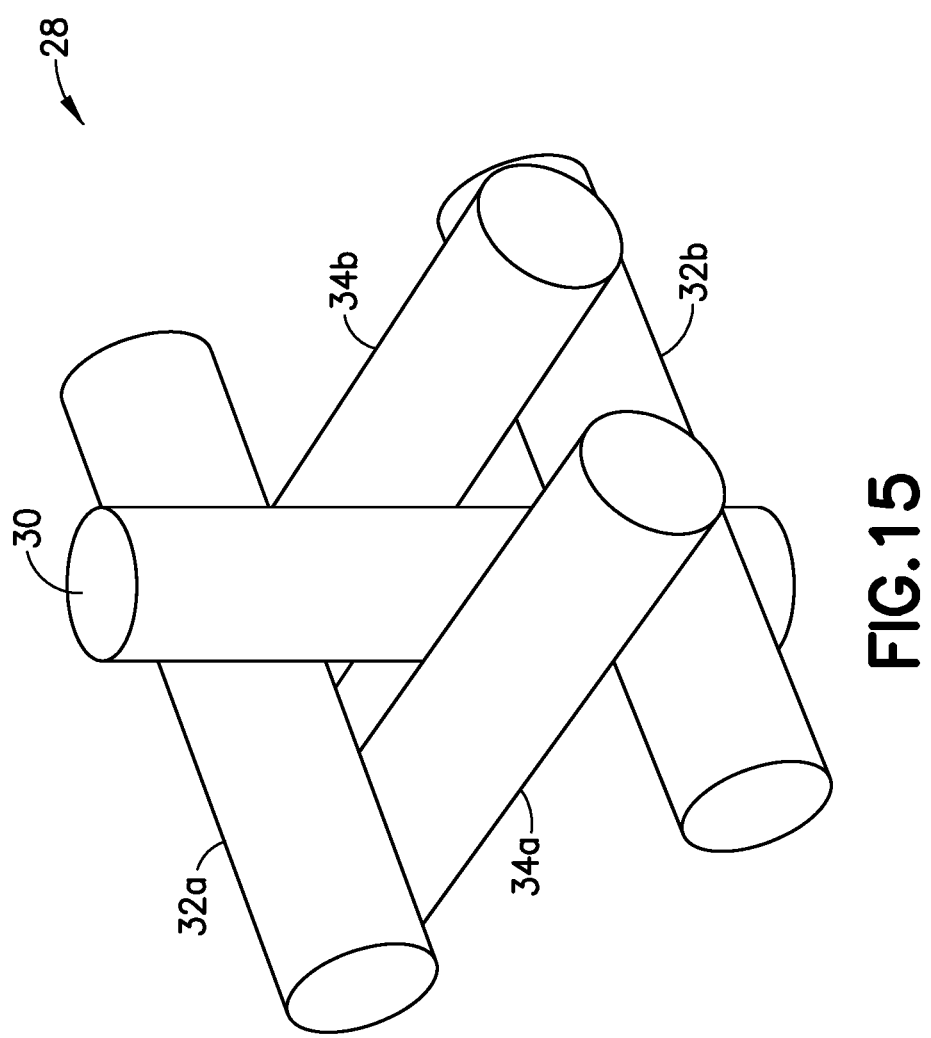
FIG. 15 is a diagram showing an isometric view of mutually orthogonal components of a power transmitter in accordance with another embodiment.

FIG. 15 illustrates a transmitter 28 having an improved design as compared to the design shown in FIG. 6. The transmitter 28 in this alternate embodiment comprises the following components: a z-axis transmitter coil 30 having an axis parallel to a z direction; first and second x-axis transmitter coils 34a and 34b having axes parallel to an x direction and disposed on opposite sides of the z-axis transmitter coil 30; and first and second y-axis transmitter coils 32a and 32b having axes parallel to a y direction and disposed on opposite sides of the z-axis transmitter coil 30 respectively above and below the first and second x-axis transmitter coils 34a and 34b. All component coils share the same center, which leads to a far field that is closer, simplifying control and allowing the receiver to get closer to the transmitter. In designing the circuit to achieve desired resonant frequencies, one must take into account the fact that the inductances of the x- and y-axis components are different from that of the z-axis component due to the different number of coils in each component. In the same way, when regulating power going into the transmitter, the system should be designed to send 1× power to the z-axis transmitter coil 30 and ½× power to each of the first and second x-axis transmitter coils 34a and 34b and each of the first and second y-axis transmitter coils 32a and 32b.

Using the same magnetic field steering concept, but a simpler algorithm, one could provide a system for wireless power transmission for use in vehicles such as automobiles, buses and airplanes. For example, an automobile typically incorporates a large number of small electric motors distributed throughout the automobile.

Figure 16:
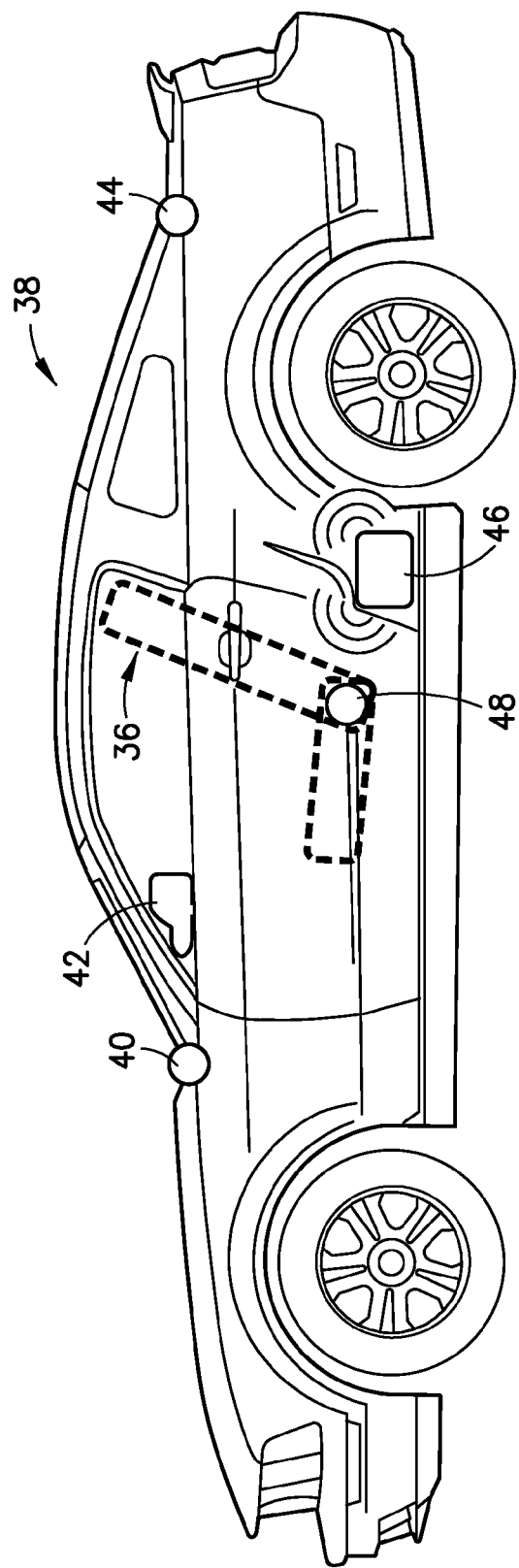
FIG. 16 is a diagram representing an elevation view of an automobile having components which can be powered by a wireless power transmission system.

FIG. 16 is a diagram representing an elevation view of an automobile 38 that incorporates a windshield wiper motor 40, a rear view mirror motor 42, a trunk motor/solenoid 44, and a seat motor 48 for changing the configuration of a seat 50. Each of these motors may take the form of electric motors designed to be powered wirelessly by means of a three-dimensional transmitter 46 incorporated in the automobile 38.

Most of these motors, with sometimes the exception of the windshield wiper motor 40, do not operate at the same time. It is thus sufficient to place a single (or multiple if desired) 3-D transmitter 46 at the epicenter of the car that can wirelessly power and commutate the small electric motors. Because these smaller motors are not safety critical, this motor architecture may act as the field test gateway. To eliminate the need for all physical wires to these motors, the buttons that drivers use to command the motors can be energy harvesting buttons that use the human push energy to send a wireless signal to the 3-D transmitter module.

The benefits of including such a wireless power transmission system in an automobile include the following: (1) reduced assembly time because wire harnesses do not have to worm through the entire vehicle, and fewer holes are needed; (2) lighter weight; and (3) fewer holes drilled for less cost and higher structural integrity. Currently holes must be drilled into the automobile frame and door to feed through power wires for rear view mirror and window slider motors.

Because the positions and orientations of the various wirelessly powered electric motors are fixed relative to the 3-D transmitter 46, it is not necessary to provide an active means for monitoring the locations of the electric motors being powered. The unit vectors, amplitude for each vector component and frequencies can all reside in a ROM look-up table.

In accordance with some of the embodiments disclosed above, magnetic field superposition is used to control a magnetic field's orientation at a particular position. The orthogonal arrangement of the transmitter coils ensures that a receiver can have any desired resultant magnetic field at any point in 3-D space, which allows the target object to remain operational at all times even while mobile. The wireless power transmission systems disclosed herein are not limited in application to situations wherein fixed transmitters transmit only a fixed magnetic field, which requires that the receivers be fixed in position and orientation. For wireless power applications in general, the systems disclosed herein allow freedom of movement while a wirelessly powered device is being carried.

Magnetic field steering can be used in conjunction with frequency differentiation to create a double filter. One could also more precisely control the magnetic field's orientation and therefore reduce or even eliminate the need for frequency differentiation. This allows the system to occupy a narrower frequency band, therefore reducing interference with other wireless systems in the surrounding area.

The equatorial field, as illustrated in FIG. 2, is weakest at any given distance. The polar field, as illustrated by the location of receiver coil 6A in FIG. 1, is two times stronger. The use of magnetic field superposition, as illustrated in FIGS. 4 and 7, almost always places a receiver in a polar position relative to the transmitter, so power transfer is more efficient than the prior art system depicted in FIG. 2.

With black spotting, one can reduce interference with objects at known locations, thus further improving the frequency band occupation. In addition, black spotting can help ensure that unintended objects do not couple with the transmitters. This benefits safety and transmission efficiency.

When using wireless power on a factory floor or inside an airplane, there are bound to be objects that unintentionally couple into a wireless link. At best, this results in energy unnecessarily dissipated in these objects. At worst, this can result in safety issues because wasted energy usually turns into heat, which can lead to material corrosion or combustion. The "black spotting" feature disclosed hereinabove can prevent this from happening.

While apparatus and methods for have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

As used in the claims, the term "computer system" should be construed broadly to encompass a system having at least one computer or processor, and which may have multiple computers or processors. As used in the preceding sentence, the terms "computer" and "processor" both refer to devices having a processing unit (e.g., a central processing unit) and some form of memory (i.e., computer-readable medium) for storing a program which is readable by the processing unit. For example, the microcontroller 50 shown in FIG. 3 qualifies as a computer system under the foregoing definition. As used herein, the term "microcontroller" refers to a small computer on an integrated circuit containing a processor core, memory and programmable input/output peripherals.

In addition, the method claims set forth hereinafter should not be construed to require that the steps recited therein be performed in alphabetical order (any alphabetical ordering in the claims is used solely for the purpose of referencing previously recited steps) or in the order in which they are recited. Nor should they be construed to exclude any portions of two or more steps being performed concurrently or alternatingly.

As used in the claims, the term "location" includes position and orientation.

The structure corresponding to means for supplying current having an amplitude, as recited in the claims, includes a power regulator in combination with a variable frequency drive as depicted in FIG. 3 or a variable frequency signal generator in combination with a variable power amplifier, and equivalents thereof.

The invention claimed is:

1. A method for wirelessly transmitting power to an electric device, comprising:
   providing a transmitter having at least two transmitter coils arranged at fixed positions and orientations relative to each other;
   locating the transmitter with respect to a space containing a first electric device having a first receiver coil;
   determining an orientation of an axis of the first receiver coil of the first electric device relative to a frame of reference of the transmitter;
   computing amplitudes and frequencies for respective alternating electric currents to be supplied to respective transmitter coils of the transmitter based at least in part on the orientation of the axis of the first receiver coil of the first electric device, the computed amplitudes and frequencies being calculated to produce a first resultant magnetic field having a magnetic field line which is located along the axis of the first receiver coil of the first electric device when supplied to respective transmitter coils of the transmitter; and
   providing the respective alternating electric currents to respective transmitter coils of the transmitter at a first time.

2. The method as recited in claim 1, wherein the axis of the first receiver coil of the first electric device is not collinear with an axis of any of the transmitter coils.

3. The method as recited in claim 1, wherein the transmitter coils of the transmitter are mutually orthogonal.

4. The method as recited in claim 1, wherein said step of determining an orientation of the axis of the first receiver coil of the first electric device comprises:

creating a local magnetic field at each coordinate and each orientation in a space; and
detecting a decrease in the energy in the transmitter.

5. The method as recited in claim 1, wherein said step of determining an orientation of the axis of the first receiver coil of the first electric device coil comprises:
   sweeping ratios of respective powers supplied to each transmitter coil; and
   detecting a power drain in the transmitter.

6. The method as recited in claim 1, wherein the space contains a second electric device having a receiver coil and having a location different than the location of the first electric device, further comprising providing respective alternating electric currents to respective transmitter coils of the transmitter which produce at a second time different than said first time a second resultant magnetic field having a magnetic field line which is located along the axis of the receiver coil of the second electric device.

7. The method as recited in claim 6, further comprising:
   retrieving unit vectors and amplitudes associated with said first resultant magnetic field from a look-up table prior to said first time; and
   retrieving unit vectors and amplitudes associated with said second resultant magnetic field from said look-up table prior to said second time.

8. The method as recited in claim 1, wherein the first electric device has a second receiver coil having an axis different than the axis of said first receiver coil, further comprising providing respective alternating electric currents to respective transmitter coils of the transmitter which produce at a second time different than said first time a second resultant magnetic field having a magnetic field line which is located along the axis of the second receiver coil of the first electric device.

9. A method for wirelessly transmitting power to an electric device, comprising:
   providing a first transmitter having at least two transmitter coils arranged at fixed positions and orientations relative to each other;
   providing a second transmitter having at least two transmitter coils arranged at fixed positions and orientations relative to each other;
   locating the first and second transmitters on different sides of a space containing a first electric device having a first receiver coil;
   determining an orientation of an axis of the receiver coil of the first electric device relative to a frame of reference of the first and second transmitters;
   computing amplitudes and frequencies for respective alternating electric currents to be supplied to respective transmitter coils of the first and second transmitters based at least in part on the orientation of the axis of the receiver coil of the first electric device, the computed amplitudes and frequencies being calculated to produce a first resultant magnetic field having a magnetic field line which is located along the axis of the receiver coil of the first electric device when supplied to respective transmitter coils of the first and second transmitters; and
   providing the respective alternating electric currents to respective transmitter coils of the first and second transmitters at a first time.

10. The method as recited in claim 9, wherein the space contains a second electric device having a receiver coil and having a location different than the location of the first electric device, further comprising providing respective alternating electric currents to respective transmitter coils of the first and second transmitters which produce at a second time different than said first time a second resultant magnetic field having a magnetic field line which is located along the axis of the receiver coil of the second electric device.

11. The method as recited in claim 9, wherein the first electric device has a second receiver coil having an axis different than the axis of said first receiver coil, further comprising providing respective alternating electric currents to respective transmitter coils of the transmitter which produce at a second time different than said first time a second resultant magnetic field having a magnetic field line which is located along the axis of the second receiver coil of the first electric device.

12. The method as recited in claim 11, wherein said first electric device is an electric motor and said first and second receiver coils are first and second windings respectively of said electric motor.

13. A method for wirelessly transmitting power to an electric device, comprising:
providing a first transmitter having at least two transmitter coils arranged at fixed positions and orientations relative to each other;
providing a second transmitter having at least two transmitter coils arranged at fixed positions and orientations relative to each other;
locating the first and second transmitters on different sides of a space containing a first electric device having a first receiver coil; and
providing respective alternating electric currents to respective transmitter coils of the first and second transmitters which produce at a first time a first resultant magnetic field having a magnetic field line which is located along the axis of the first receiver coil of the first electric device,
wherein the space contains a second electric device having a location different than the location of the first electric device, and said first resultant magnetic field produced at said first time has zero magnetic flux at the location of said second electric device.

14. The method as recited in claim 1, wherein said step of providing the respective alternating electric currents to respective transmitter coils comprises:
generating respective direct electric currents having those respective computed amplitudes;
converting each direct electric current into a respective alternating electric current with a respective computed frequency; and
supplying the respective alternating electrical currents having said respective computed amplitudes and computed frequencies to respective transmitter coils of the transmitter.

15. The method as recited in claim 9, wherein said step of providing the respective alternating electric currents to respective transmitter coils comprises:
generating respective direct electric currents having those respective computed amplitudes;
converting each direct electric current into a respective alternating electric current with a respective computed frequency; and
supplying the respective alternating electrical currents having said respective computed amplitudes and computed frequencies to respective transmitter coils of the first and second transmitters.

16. A system for wireless power transmission comprising:
a receiver coil having an axis;
first, second and third transmitter coil components;
a computer system programmed to determine an orientation of an axis of the receiver coil relative to a frame of reference of the transmitter coil components and then compute respective amplitudes and frequencies of respective alternating electric currents to be supplied to said first, second and third transmitter coil components based at least in part on the orientation of the axis of the receiver coil, the computed amplitudes and frequencies being calculated to produce a resultant magnetic field having a magnetic field line which is located along the axis of said receiver coil when supplied to said first, second and third transmitter coil components;
a power regulator that receives amplitude commands representing the respective computed amplitudes from said computer system and outputs respective direct electric currents having those respective computed amplitudes; and
a variable frequency drive circuit that receives frequency commands representing the respective computed frequencies from said computer system and receives the respective direct electric currents from said power regulator, converts each direct electric current into a respective alternating electric current with a respective computed frequency, and supplies the respective alternating electrical currents having said respective computed amplitudes and computed frequencies to said first, second and third transmitter coil components respectively.

17. The system as recited in claim 16, wherein each of said first, second and third transmitter coil components comprises a respective transmitter coil.

18. The system as recited in claim 16, wherein said first transmitter coil component comprises a first transmitter coil, said second transmitter coil component comprises mutually parallel second and third transmitter coils, and said third transmitter coil component comprises mutually parallel fourth and fifth transmitter coils, said second and third transmitter coils being disposed on opposite sides of said first transmitter coil, and said fourth and fifth transmitter coils being disposed on opposite sides of said first transmitter coil respectively above and below said second and third transmitter coils.

19. The system as recited in claim 16, wherein said receiver coil is a winding of an electric motor.

* * * * *